United States Patent [19]
Raina et al.

[11] Patent Number: 6,140,701
[45] Date of Patent: Oct. 31, 2000

[54] SUPPRESSION OF HILLOCK FORMATION IN THIN ALUMINUM FILMS

[75] Inventors: Kanwal K. Raina; Tianhong Zhang, both of Boise; Allen McTeer, Meridan, all of Id.

[73] Assignee: Micron Technology, Inc., Boise, Id.

[21] Appl. No.: 09/387,133

[22] Filed: Aug. 31, 1999

[51] Int. Cl.$^7$ .............................................. H01L 21/4763
[52] U.S. Cl. ........................ 257/734; 257/773; 257/776
[58] Field of Search .................................... 438/618, 597; 257/734, 773, 776

[56] References Cited

U.S. PATENT DOCUMENTS

| | | |
|---|---|---|
| 4,012,756 | 3/1977 | Chaudhari et al. . |
| 5,231,306 | 7/1993 | Meikle et al. . |
| 5,404,070 | 4/1995 | Tsai et al. . |
| 5,700,718 | 12/1997 | McTeer . |
| 5,786,232 | 7/1998 | Stansbury . |
| 5,811,318 | 9/1998 | Kweon . |
| 5,838,052 | 11/1998 | McTeer . |
| 5,867,242 | 2/1999 | Yao et al. . |
| 5,868,951 | 2/1999 | Schuck, III et al. . |

OTHER PUBLICATIONS

Onishi et al., "Influence of adding transition metal elements to an aluminum target on electrical resistivity and hillock resistance in sputter–deposited aluminum alloy thin films" J. Vac. Technol. A 14(5), Sep./Oct. 1996, pp. 2728–2735.

*Primary Examiner*—Kevin M. Picardat
*Assistant Examiner*—Deven M. Collins
*Attorney, Agent, or Firm*—Killworth, Gottman, Hagan & Schaeff, L.L.P.

[57] ABSTRACT

A multilayer structure is provided which suppresses hillock formation due to post-heat treatment steps in thin aluminum films deposited on other substrates by sandwiching the aluminum film between thin layers of aluminum titanium nitride. The first aluminum titanium nitride layer acts as a compatibilizing layer to provide a better match between the coefficients of thermal expansion of the substrate and aluminum metal layer. The second aluminum titanium nitride layer acts as a cap layer to suppress hillock formation.

11 Claims, 4 Drawing Sheets

SUPPRESSION OF HILLOCK FORMATION IN THIN ALUMINUM FILMS

This invention was made with Government support under Contract No. DABT 63-97-C-0001 awarded by the Advanced Research Projects Agency (ARPA). The Government has certain rights in this invention.

BACKGROUND OF THE INVENTION

The present invention relates to electrical interconnection lines which suppress hillock formation in thin aluminum metal layers for use in semiconductor devices including field emission displays, and more particularly to the use of a multilayer structure which includes aluminum titanium nitride layers.

Integrated circuits are manufactured by an elaborate process in which a variety of different electronic devices are integrally formed on a small silicon wafer. Conventional electronic devices include capacitors, resistors, transistors, diodes, and the like. In advanced manufacturing of integrated circuits, hundreds of thousands of electronic devices are formed on a single wafer.

One of the steps in the manufacture of integrated circuits is to form metal interconnect lines between the discrete electronic devices on the integrated circuit. The metal interconnect lines allow for an electrical current to be delivered to and from the electronic devices so that the integrated circuit can perform its intended function.

The metal interconnect lines generally comprise narrow bands of aluminum. Aluminum is typically used because it has a relatively low resistivity, good current-carrying density, superior adhesion to silicon dioxide, and is available in high purity. Each of these properties is desirable in interconnect lines since they result in a faster and more efficient electronic circuit.

The computer industry is constantly under market demand to increase the speed at which integrated circuits operate and to decrease the size of integrated circuits. To accomplish this task, the electronic devices on a silicon wafer are continually being increased in number and decreased in dimension. In turn, the dimension of the metal interconnect lines must also be decreased. This process is known as miniaturization.

Metal interconnect lines are now believed to be one of the limiting factors in the miniaturization of integrated circuits. It has been found, however, that by using more than one level in the interconnect, the average interconnect link is reduced and with it the space required on the integrated circuit. Thus, integrated circuits can further be reduced in size. These multi-level metals are referred to as metal interconnect stacks, named for the multiple layers of different metals which are stacked on top of each other. As heat treatments following metal deposition steps get longer and higher temperatures occur, a phenomenon referred to as "void formation" has been found to occur more frequently. In general, void formation is a process in which minute voids are formed within the metal interconnect line which voids coalesce at flux divergence sites, such as grain boundary triple points, of the metal interconnect line. As a result of the coalescing of the voids, the aluminum in the line begins to narrow at a specific location. If the aluminum gets sufficiently narrow, the metal interconnect line can void out so as to cause a gap in the line. Such a gap results in an open circuit condition and prevents the integrated circuit from operating in a proper manner.

Void formation is generally caused by either electro migration or stress migration. Electro migration occurs as an electrical current flows through the aluminum portion of an interconnect line. When a voltage is applied across the aluminum, electrons begin to flow through the aluminum. These electrons impart energy to the aluminum atoms sufficient to eject aluminum atoms from their lattice sites. As the aluminum atoms become mobile, they leave behind vacancies. In turn, the vacancies are also mobile, because they can be filled by other aluminum atoms which then open new vacancies. In the phenomenon of electro migration, the vacancies formed throughout the aluminum line tend to coalesce at flux divergence sites such as gain boundary triple points of the metal line, thereby forming voids that narrow the metal interconnect line as discussed above. Once the metal interconnect line is narrowed, the current density passing through that portion of the line is increased. As a result, the increased current density accelerates the process of electro migration, thereby continually narrowing the line until a gap forms and the line fails.

It is also thought that void formation occurs as a result of stress migration inherent in aluminum line deposition. The deposition of the aluminum in the metal interconnect lines is usually conducted at an elevated temperature. As the aluminum in the line cools, the aluminum begins to contract. The insulation layer positioned under the aluminum layer, typically silicon dioxide, also contracts. Because the aluminum and the silicon dioxide have greatly different coefficients of thermal expansion and contraction, however, the two materials contract at different rates. This contraction causes an internal stress within the aluminum portions of the metal interconnect lines.

A related reliability problem with aluminum interconnect lines is the formation of hillocks. Hillocks are spike-like projections which erupt in response to a state of compressive stress in thin metal films such as aluminum films and consequently protrude from a film's surface. Hillocks are especially a problem in thin aluminum films because the coefficient of thermal expansion of aluminum is almost ten times as large as that of silicon. When the much more massive silicon wafer is heated, for example during an annealing step, large compressive stresses are induced. Further, the low melting point of aluminum and consequent high rate of vacancy diffusion in aluminum films encourages hillock growth. Hillocks can cause both interlevel as well as intralevel interconnect shorting when they penetrate the dielectric layer that separates neighboring metal lines.

Previously, attempts have been made to suppress hillock formation either by anodizing the aluminum line or by alloying the aluminum with other metals such as tantalum (Ta), titanium (Ti), neodymium (Nd), yttrium (Y), gadolinium (Gd), nickel (Ni), iron (Fe), cobalt (Co), and the like. However, anodization adds a step and complicates the manufacturing process. Further, alloys of aluminum still present both thermal and mechanical stability problems besides contributing to higher resistivity values.

Thin aluminum films also find use as the cathode in thin film transistor (TFT) devices such as, for example, flat panel displays, liquid crystal displays, and field emission devices. The manufacture of TFT devices presents manufacturing challenges as the formation of the components of such devices is both complicated and costly. Again, as thin aluminum films must be deposited onto glass or other dielectric substrates, the same mismatches in coefficients of thermal expansion as well as the thermal and mechanical instability of thin aluminum films present problems, including hillock formation problems.

Accordingly, there still exists a need in this art for a structure and fabrication process which achieves suppression of hillock formation while improving reliability in thin aluminum metal films.

SUMMARY OF THE INVENTION

The present invention meets that need by providing a multilayer structure which suppresses hillock formation in thin aluminum films by sandwiching the aluminum film between thin layers of aluminum titanium nitride. In accordance with one aspect of the invention, a process for forming an electrical interconnect line in a semiconductor device is provided and includes the steps of providing a substrate, depositing a first layer of $Al_xTi_yN_z$ thereon, wherein x, y, and z are numbers >0 and <1, depositing a layer of aluminum metal onto the first layer of $Al_xTi_yN_z$, and depositing a second layer of $Al_xTi_yN_z$, where x, y, and z may be the same as or different from the first layer onto the aluminum metal layer. The first aluminum titanium nitride layer acts as a compatibilizing layer to provide a better match between the coefficients of thermal expansion of the substrate and aluminum metal layer. The second aluminum titanium nitride layer acts as a cap later to suppress hillock formation.

In a preferred form, the substrate comprises silicon or silicon oxide. Generally, the relative molar amounts of aluminum, titanium, and nitrogen may vary somewhat. Preferred molar amounts range from about 0.3 to about 0.95 Al, from about 0.05 to about 0.7 Ti, and from about 0.1 to about 0.6 N, with a most preferred ratio being from about 0.45–0.50 Al, about 0.15 Ti, and from about 0.35–0.40 N. The layers are preferably deposited by sputtering. Depending upon the particular device and usage, the first and second layers of $Al_xTi_yN_z$ are between about 100 to about 800 Å thick, and the layer of aluminum is from about 500 to about 5000 Å thick.

The present invention also provides a process for suppressing hillock formation in an aluminum interconnect line in a semiconductor device comprising the steps of providing a silicon substrate, sputter depositing a first layer of $Al_xTi_yN_z$ onto the silicon substrate, wherein x, y, and z are numbers >0 and <1 and, depositing a layer of aluminum metal onto the layer of $Al_xTi_yN_z$, sputter depositing a second layer of $Al_xTi_yN_z$ over the aluminum metal, where x, y, and z may be the same as or different from the first layer, and heating the silicon substrate to a temperature greater than about 300° C., whereby the second layer of $Al_xTi_yN_z$ acts as a cap layer to suppress hillock formation in the aluminum layer. As used herein, the term silicon substrate refers to silicon structures, including a semiconductor layer in the process of fabrication.

In another embodiment of the invention, a silicon structure is provided and includes a silicon substrate, a first layer of $Al_xTi_yN_z$ deposited on the silicon substrate, wherein x, y, and z are numbers >0 and <1, a layer of aluminum metal deposited onto the first layer of $Al_xTi_yN_z$, and a second layer of $Al_xTi_yN_z$ deposited onto the aluminum metal layer, where x, y, and z may be the same as or different from the first layer.

In yet another embodiment, a method for fabricating a field emission device is provided and includes the steps of providing a substrate, forming a cathode on the substrate by depositing a first layer of $Al_xTi_yN_z$ onto the substrate, wherein x, y, and z are numbers >0 and <1, depositing a layer of aluminum metal onto the first layer of $Al_xTi_yN_z$; and depositing a second layer of $Al_xTi_yN_z$ onto the aluminum metal layer, where x, y, and z may be the same as or different from the first layer, forming a dielectric layer on the cathode and a gate on the dielectric layer, the dielectric layer and the gate including at least one opening therein, and forming an emitter on the cathode, the emitter extending through the at least one opening. In a preferred form, the substrate comprises glass.

In yet another embodiment of the invention, a field emission display device is provided and includes a glass substrate, a cathode on the glass substrate with the cathode including a plurality of emitters thereon, a dielectric layer on the cathode, and a gate positioned on the dielectric layer including a series of openings corresponding to the position of the emitters on the cathode. The cathode comprises a first layer of $Al_xTi_yN_z$ deposited on the silicon substrate, wherein x, y, and z are numbers >0 and <1, a layer of aluminum metal deposited onto the first layer of $Al_xTi_yN_z$, and a second layer of $Al_xTi_yN_z$ deposited onto the aluminum metal layer, where x, y, and z may be the same as or different from the first layer.

In each of these devices and fabrication methods, the sandwich construction of $Al_xTi_yN_z/Al/Al_xTi_yN_z$ improves reliability and suppresses hillock formation. Accordingly, it is a feature of the present invention to provide a structure and fabrication process which achieves suppression of hillock formation while improving reliability in thin aluminum metal films. This, and other features and advantages of the present invention, will become apparent from the following detailed description, the accompanying drawings, and the appended claims.

DETAILED DESCRIPTION OF THE PREFERRED EMBODIMENTS

The present invention provides for structures and fabrication processes which achieve suppression of hillock formation while improving reliability in thin aluminum metal films. As used herein, the term opening refers to and includes vias, trenches, grooves, contact holes, and the like in a substrate. The term silicon substrate refers to and includes silicon wafers and other silicon-based structures in the process of fabrication, a semiconductor layer, including a semiconductor layer in the process of fabrication, and the like. The term fabrication means the process of forming patterns on a silicon structure or semiconductor structure through photolithography.

The present invention addresses the dual problems of reliability of thin aluminum films and hillock formation in such films by providing a sandwich construction in which a first aluminum titanium nitride layer acts as a compatibilizing layer between the thin aluminum film and the substrate to provide a better match between the respective coefficients of thermal expansion of the substrate and aluminum metal layer. The second aluminum titanium nitride layer acts as a cap later to suppress hillock formation during subsequent heating/annealing steps.

Figure 1:
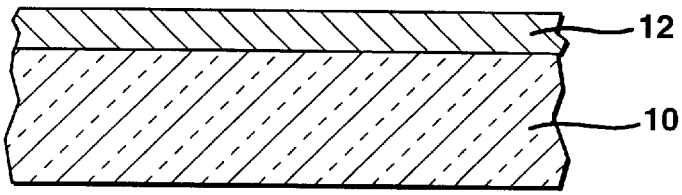
FIG. 1 is a cross-sectional side view of a substrate of an in-process wafer illustrating the formation of the first $Al_xTi_yN_z$ layer on the substrate.

As illustrated in FIG. 1, a substrate 10 is provided and a first $Al_xTi_yN_z$ layer 12 is deposited thereon. Substrate 10 may be any substrate used in electronic devices fabrication including silicon, silicon dioxide, and various glasses such as, for example, borosilicate glass and soda lime glass. In a preferred form, the substrate 10 comprises a silicon base with a layer of silicon dioxide thereon. Layer 12 may be deposited by any known technique in this art such as, for example, sputter deposition using a metal target or targets to provide the desired ratio of aluminum, titanium, and nitrogen to layer 12. Typically, layer 12 is deposited to a thickness of between about 100 to about 800 Å.

Figure 2:
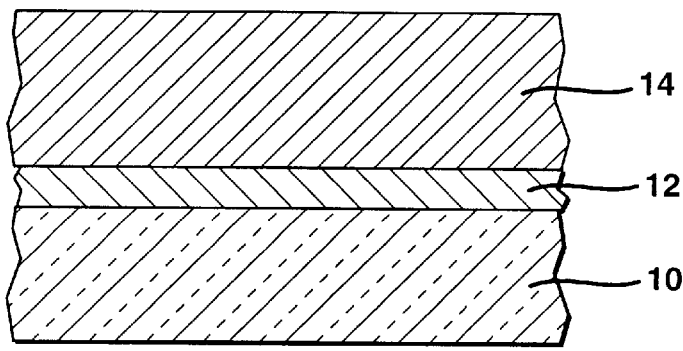
FIG. 2 is a cross-sectional side view of a substrate of an in-process wafer illustrating the formation of the aluminum layer on the first $Al_xTi_yN_z$ layer.

The next step in the process is depicted in FIG. 2 and involves the deposition of aluminum film layer 14 over first $Al_xTi_yN_z$ layer 12. Aluminum film 14 is preferably deposited using a sputtering technique and has a thickness which is from about 3 to about 10 times the thickness of layer 12. Preferably, this thickness is between about 500 to about 5000 Å. Layer 12 acts as a compatibilizing layer between substrate 10 and aluminum layer 14 to reduce high tensile stresses which would otherwise form. Silicon and silicon dioxide substrates and pure aluminum have large mismatches in their respective coefficients of thermal expansion. When subjected to the heating and cooling steps necessary in the fabrication of semiconductor and electronic devices, the aluminum and substrate layers would expand and contract at very different rates, subjecting the relatively thin aluminum film to high tensile stresses. $Al_xTi_yN_z$ layer 12 acts to bridge the mismatch in coefficients of thermal expansion.

Figure 3:
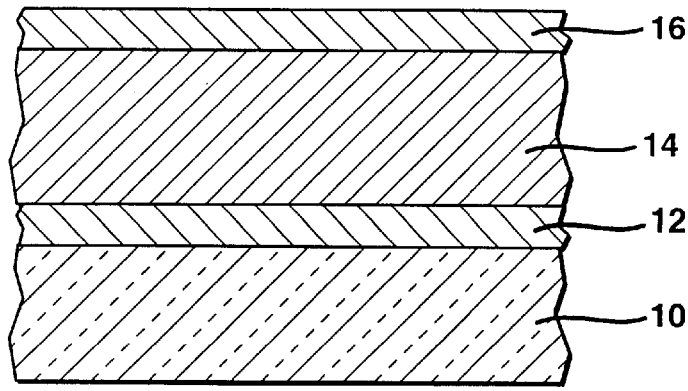
FIG. 3 is a cross-sectional side view of a substrate of an in-process wafer illustrating the formation of the second $Al_xTi_yN_z$ layer on the aluminum layer.

Referring now to FIG. 3, a cap or second layer 16 of $Al_xTi_yN_z$ is deposited, preferably also using a sputtering technique, over aluminum film 14. Second layer 16 acts as a "cap" to prevent or suppress hillock formation in underlying aluminum film layer 14. Typically, second layer 16 is deposited to a thickness of between about 100 to about 800 Å.

Figure 4:
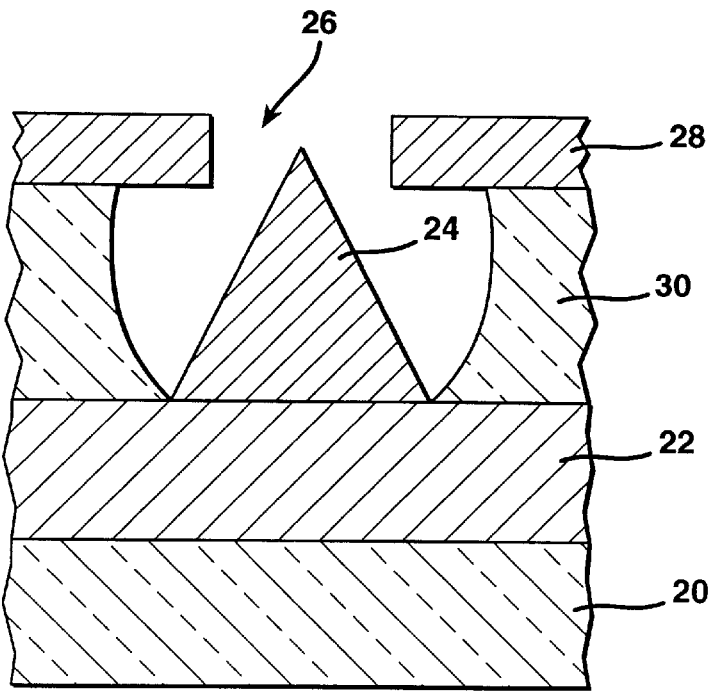
FIG. 4 is a schematic side view of the construction of a prior art field emission display device.

Referring now to FIG. 4, a prior art structure for a field emission display (FED) is illustrated. Field emission displays are emissive displays with a cold cathode electron source. A typical field emission display comprises a matrix-addressed array of pixels arranged in rows and columns. Each pixel contains the field emitter array which comprises multiple micro-sized conductive cones, termed "microtips." Such microtips are deposited on metal films which function as the cathode, with the tips of the cones protruding through openings in another electrically conductive layer termed a gate. An insulating layer separates the electrically conductive cathode and gate layers.

As shown in FIG. 4, a cathode 22 is deposited onto glass substrate 20. Cathode 22 comprises a thin metal film. In prior art FIG. 4, that metal film is either anodized aluminum or an alloy of aluminum with another metal or metals including tantalum, titanium, neodymium, yttrium, iron, cobalt, nickel, gadolinium, or copper. Such anodization or alloying was performed in attempts to suppress hillock formation in the aluminum film. Microtip 24 extends through an opening 26 in gate layer 28. A layer of insulative material 30 such as silicon separates cathode layer 22 and gate layer 28.

Figure 5:
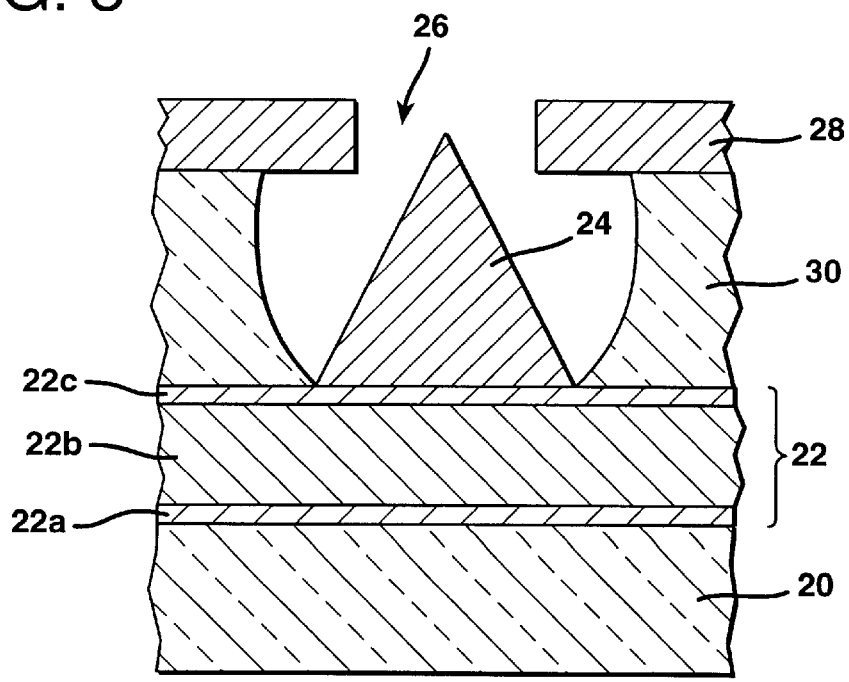
FIG. 5 is a schematic side view of the construction of a field emission display device in accordance with the present invention.

Referring now to FIG. 5, where like elements are represented by like reference numerals, a field emission display in accordance with the present invention is shown. There, cathode 22 comprises a first layer 22a of $Al_xTi_yN_z$ deposited on glass substrate 20, a layer 22b of aluminum metal deposited on first layer 22a, and a second layer 22c of $Al_xTi_yN_z$ deposited on aluminum metal layer 22b. This construction forms a cathode in which layer 22a acts as a compatibilizing layer to provide a better match between the coefficients of thermal expansion of the glass substrate 20 and aluminum metal layer 22b and second aluminum titanium nitride layer 22c acts as a cap layer to suppress hillock formation.

In order that the invention may be more readily understood, reference is made to the following example, which is intended to be illustrative of the invention, but is not intended to be limiting in scope.

EXAMPLE

Figure 6:
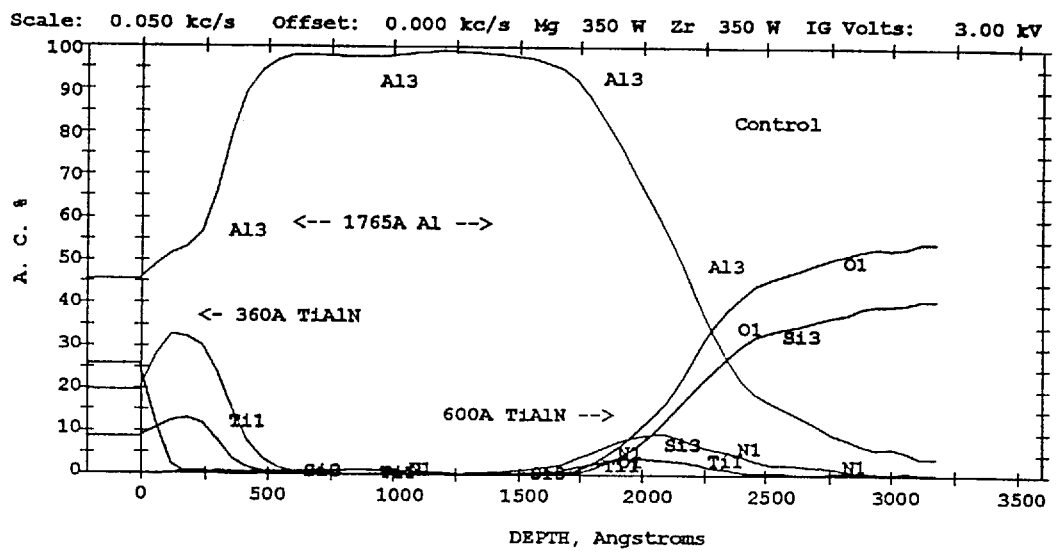
FIG. 6 is a graph of an X-ray induced photoelectron spectroscopy depth profile of an as-deposited 300 Å $Al_xTi_yN_z$/2000 Å Al/300 Å $Al_xTi_yN_z$ on silicon dioxide/silicon wafer layer structure.
Figure 7:
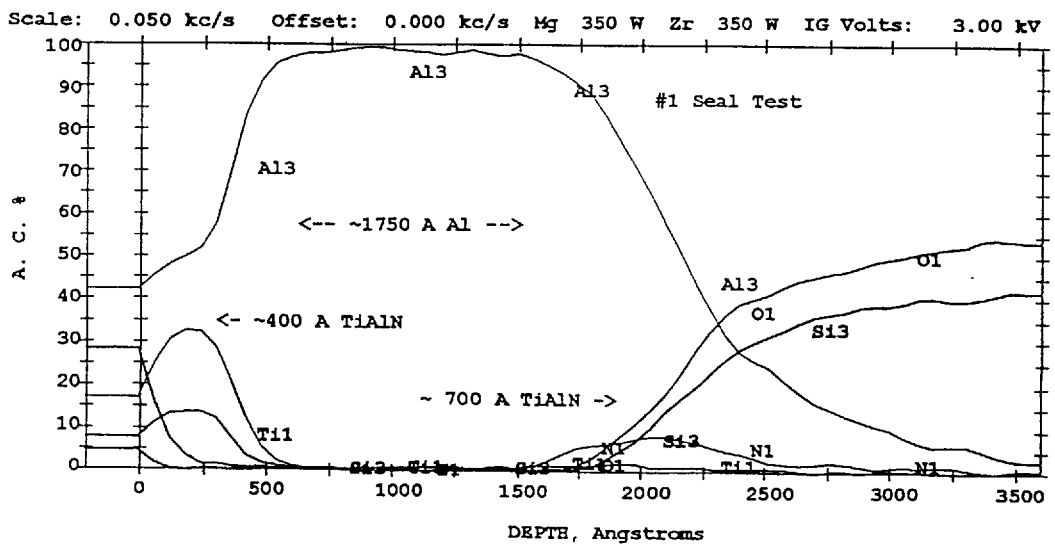
FIG. 7 is a graph of an X-ray induced photoelectron spectroscopy depth profile of the layer structure of FIG. 6 after post-heat treatment at 480° C.

Two samples were prepared by sputter depositing the following onto a silicon dioxide surface of a silicon substrate: a first 300 Å thick layer of aluminum titanium nitride, followed by a 2000 Å thick layer of aluminum, followed by a second 300 Å thick layer of aluminum titanium nitride. The first sample was used as a control. The second sample was post-heat treated by annealing it at a temperature of 480° C. Depth profiles of each sample were then prepared using X-ray induced photoelectron spectroscopy (XPS). As can be seen from FIGS. 6 and 7, the profiles appear to be substantially identical indicating that there is no chemical change at the interfaces between layers in the control and post-heated structures.

Figure 8:
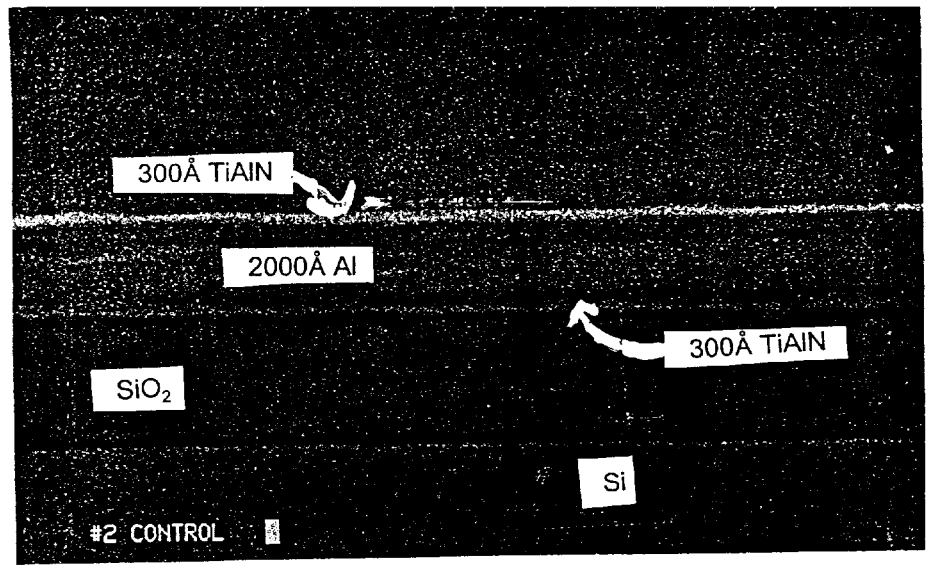
FIG. 8 is a photomicrograph of a cross-section of the as-deposited layer structure of the wafer of FIG. 6 taken by a scanning electron microscope.
Figure 9:
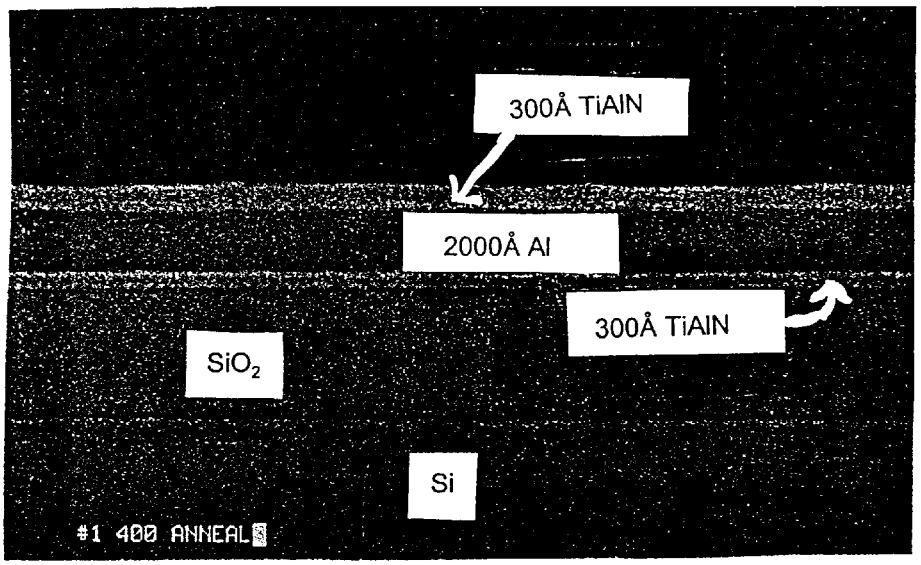
FIG. 9 is a photomicrograph of a cross-section of the layer structure of the wafer of FIG. 6 after post-heat treatment at 480° C., again taken by a scanning electron microscope.

The samples were further compared for evidence of any hillock formation in the post-heat treated sample. As shown in FIGS. 8 and 9, the cross-section of the samples, as viewed by a scanning electron microscope, shown no hillock formation in the post-heat treated sample. Surface morphology of the two samples was also observed using both a scanning electron microscope as well as an atomic force microscope. Surface roughness was similar for both the control and post-teat treated samples indicating the successful suppression of hillock formation.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A silicon structure comprising:
   a silicon substrate;
   a first layer of $Al_xTi_yN_z$ deposited on said silicon substrate, wherein x, y, and z are numbers >0 and <1;
   a layer of aluminum metal deposited onto said first layer of $Al_xTi_yN_z$; and a second layer of $Al_xTi_yN_z$ deposited onto said aluminum metal layer.

2. A silicon structure as claimed in claim 1 in which said substrate comprises silicon or silicon oxide.

3. A silicon structure as claimed in claim 1 in which x is from about 0.45–0.50, y is about 0.15, and z is from about 0.35–0.40.

4. A silicon structure as claimed in claim 1 in which said layers are deposited by sputtering.

5. A silicon structure as claimed in claim 1 in which said first and second layers of $Al_xTi_yN_z$ are between about 100 to about 800 Å thick.

6. A silicon structure as claimed in claim 1 in which said layer of aluminum is from about 500 to about 5000 Å thick.

7. A field emission display device comprising:
   a glass substrate, a cathode on said glass substrate, said cathode including a plurality of emitters thereon;
   a dielectric layer on said cathode; and
   a gate positioned on said dielectric layer including a series of openings corresponding to the position of said emitters on said cathode; said cathode comprising a first layer of $Al_xTi_yN_z$ deposited on said silicon substrate, wherein x, y, and z are numbers >0 and <1;
   a layer of aluminum metal deposited onto said first layer of $Al_xTi_yN_z$; and a second layer of $Al_xTi_yN_z$ deposited onto said aluminum metal layer.

8. A field emission display device as claimed in claim 7 in which x is from about 0.45–0.50, y is about 0.15, and z is from about 0.35–0.40.

9. A field emission display device as claimed in claim 7 in which said layers are deposited by sputtering.

10. A field emission display device as claimed in claim 7 in which said first and second layers of $Al_xTi_yN_z$ are between about 100 to about 800 Å thick.

11. A field emission display device as claimed in claim 7 in which said layer of aluminum is from about 500 to about 5000 Å thick.

* * * * *